(12) United States Patent
Yu et al.

(10) Patent No.: US 11,309,201 B2
(45) Date of Patent: Apr. 19, 2022

(54) METHOD OF FORMING DICE AND STRUCTURE OF DIE

(71) Applicant: Vanguard International Semiconductor Corporation, Hsinchu (TW)

(72) Inventors: Hsiu-Mei Yu, Hsinchu (TW); Wei-Chan Chang, Taoyuan (TW); Chang-Sheng Lin, Miaoli County (TW); Chun-Yi Wu, Taichung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/931,599

(22) Filed: May 14, 2020

(65) Prior Publication Data

US 2021/0358786 A1 Nov. 18, 2021

(51) Int. Cl.
*H01L 29/778* (2006.01)
*H01L 21/673* (2006.01)
*H01L 23/495* (2006.01)
*H01L 21/302* (2006.01)

(52) U.S. Cl.
CPC .. *H01L 21/67356* (2013.01); *H01L 21/67346* (2013.01); *H01L 23/49513* (2013.01); *H01L 21/302* (2013.01)

(58) Field of Classification Search
CPC ............... H01L 29/778; H01L 29/7781; H01L 29/7786; H01L 29/7788
See application file for complete search history.

(56) References Cited

U.S. PATENT DOCUMENTS

2016/0005845 A1\* 1/2016 Kim .................... H01L 29/0657
257/194
2017/0309676 A1\* 10/2017 Odnoblyudov ......... H01L 27/15

FOREIGN PATENT DOCUMENTS

| CN | 106374020 A | 2/2017 |
| TW | 200903856 | 1/2009 |
| TW | 201101379 A1 | 1/2011 |
| TW | M565393 U | 8/2018 |

\* cited by examiner

*Primary Examiner* — Jae Lee
(74) *Attorney, Agent, or Firm* — Winston Hsu

(57) ABSTRACT

A method of forming dice includes the following steps. First, a wafer structure is provides, which includes a substrate and a stack of semiconductor layers disposed in die regions and a scribe line region. Then, the substrate and the stack of the semiconductor layers in the scribe line region are removed to forma groove in the substrate. After the formation of the groove, the substrate is further thinned to obtain the substrate with a reduced thickness. Finally, a separation process is performed on the substrate with the reduced thickness.

6 Claims, 9 Drawing Sheets

METHOD OF FORMING DICE AND STRUCTURE OF DIE

BACKGROUND OF THE INVENTION

1. Field of the Invention

This disclosure relates generally to a method of forming semiconductor dice, and more particularly to a method of dicing a wafer structure having semiconductor layers to obtain semiconductor dice.

2. Description of the Prior Art

With the development of the 5G communication and electric vehicle industries, the demand for high-frequency, high-power semiconductor devices is also growing. These high-frequency, high-power semiconductor devices include, for example, high-frequency transistors, high-power field-effect transistors, or high electron mobility transistors (HEMT). High-frequency, high-power semiconductor devices generally use compound semiconductors, such as gallium nitride (GaN), silicon carbide (SiC) or other III-V compound semiconductors, and the electrical properties of these semiconductor devices include high operating frequency, high breakdown voltage, and low on-resistance.

In general, the process of fabricating high-frequency, high-power semiconductor devices includes epitaxially growing a stack of semiconductor layers on a wafer substrate, and then forming electrodes, plugs, interconnects, dielectric layers or passivation layers on or in the stack of semiconductor layers so as to form required high-frequency, high-power semiconductor devices in die regions of the wafer substrate. Afterward, a separation process may be performed to separate adjacent die regions within the same wafer substrate, thereby producing several semiconductor dice.

However, for the above-mentioned semiconductor devices, since the coefficient of thermal expansion (CTE) of the stack of semiconductor layers is different from that of the wafer substrate, stress may be accumulated in the stack of semiconductor layers or at the interface of the stack of semiconductor layers and the wafer substrate during the epitaxial growth process. As a result, not only may the wafer substrate deform, such as bow or warp, but also the stack of semiconductor layers may peel off from the wafer substrate, resulting in a low yield rate of the overall fabrication process. In addition, as the dimension of the wafer substrate increases, the degree of deformation may become more severe.

Therefore, there is a need to provide both an improved method of forming semiconductor dice and an improved die structure in order to solve the drawbacks in the prior art.

SUMMARY OF THE INVENTION

In view of this, one embodiment of the present disclosure provides a method of forming a dice and provide a die structure in order to solve the technical problems in the prior art.

According to one embodiment of the present disclosure, a method of forming dice is provided and includes the following steps. First, a wafer structure is provides, which includes a substrate and a stack of semiconductor layers disposed in die regions and a scribe line region. Then, the substrate and the stack of the semiconductor layers in the scribe line region are removed to forma a groove in the substrate. After the formation of the groove, the substrate is further thinned to obtain the substrate with a reduced thickness. Finally, a separation process is performed on the substrate with the reduced thickness.

According to another embodiment of the present disclosure, a die structure having a high-electron mobility transistor device includes a substrate having a first thickness and a stack of semiconductor layers having a second thickness disposed on the substrate. The ratio of the second thickness and the first thickness is from 0.004 to 0.5.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For more complete understanding of the present invention and its advantage, reference is now made to the following description, taken in conjunction with accompanying drawings, in which.

DETAILED DESCRIPTION

Figure 1:
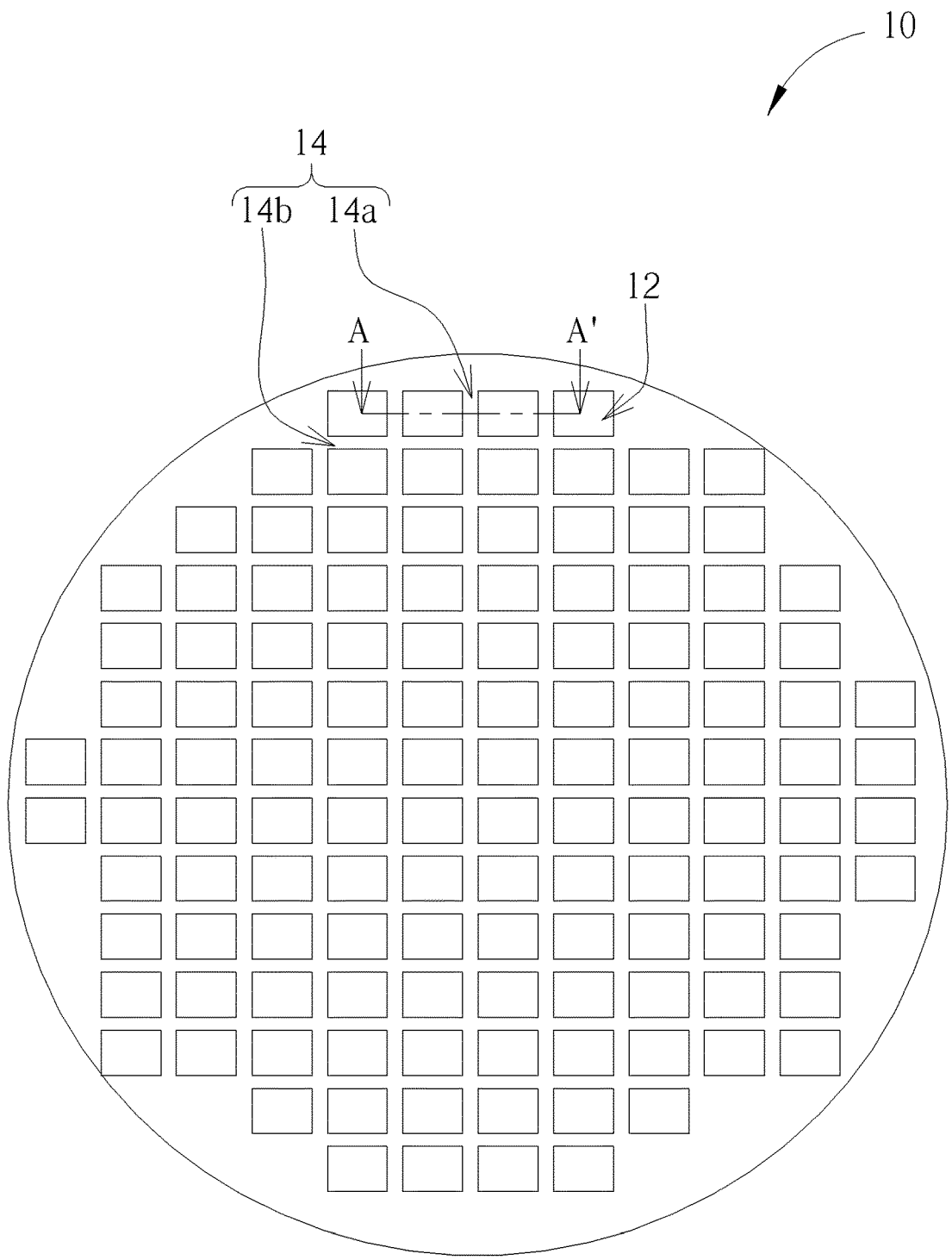
FIG. 1 is a schematic top view of a wafer structure according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

The terms, such as "coupled to" and "electrically connected to", disclosed herein encompass all means of directly and indirectly electrical connection. For example, when an element or layer is referred to as being "coupled to" or "electrically connected to" another element or layer, it may be directly coupled or electrically connected to the other element or layer, or intervening elements or layers may be presented.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as N-type or P-type.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

Figure 9:
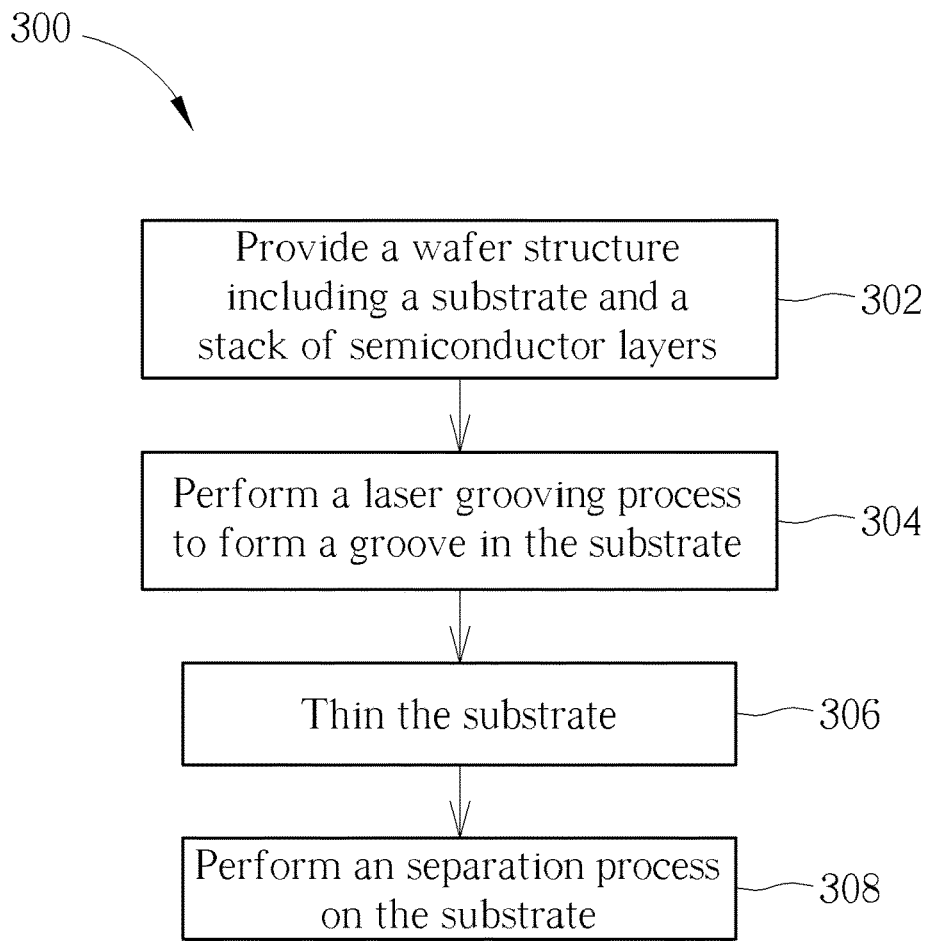
FIG. 9 is a flowchart illustrating a method of forming a plurality of dice according to one embodiment of the present disclosure.

FIG. 1 is a schematic top view of a wafer structure according to one embodiment of the present disclosure. FIG. 9 is a flowchart illustrating a method of forming a plurality of dice according to one embodiment of the present disclosure. According to one embodiment of the present disclosure, the method 300 of forming a plurality of dice includes providing a wafer structure including a substrate and a stack of the semiconductor layers (step 302). At the stage of the fabrication process shown in FIG. 1, the wafer structure 10 may be a wafer structure 10 which is processed by an appropriate semiconductor processes (e.g., epitaxial growth, deposition, etching, doping, etc.) and is defined into a plurality of die regions 12 and a plurality of scribe line regions 14 disposed between the die regions 12. At least one semiconductor device, such as a high-frequency transistor device, a high-power transistor device, or a high electron mobility transistor device, but not limited thereto, may be disposed in each of the die regions 12. The scribe line regions 14 may include interlacing sub-scribe line regions, such as columns of scribe line regions 14a and rows of scribe line regions 14b. The scribe line regions 14 may separate two adjacent die regions 12, and their positions may correspond to the positions of the subsequently fabricated scribe lines.

Figure 2:
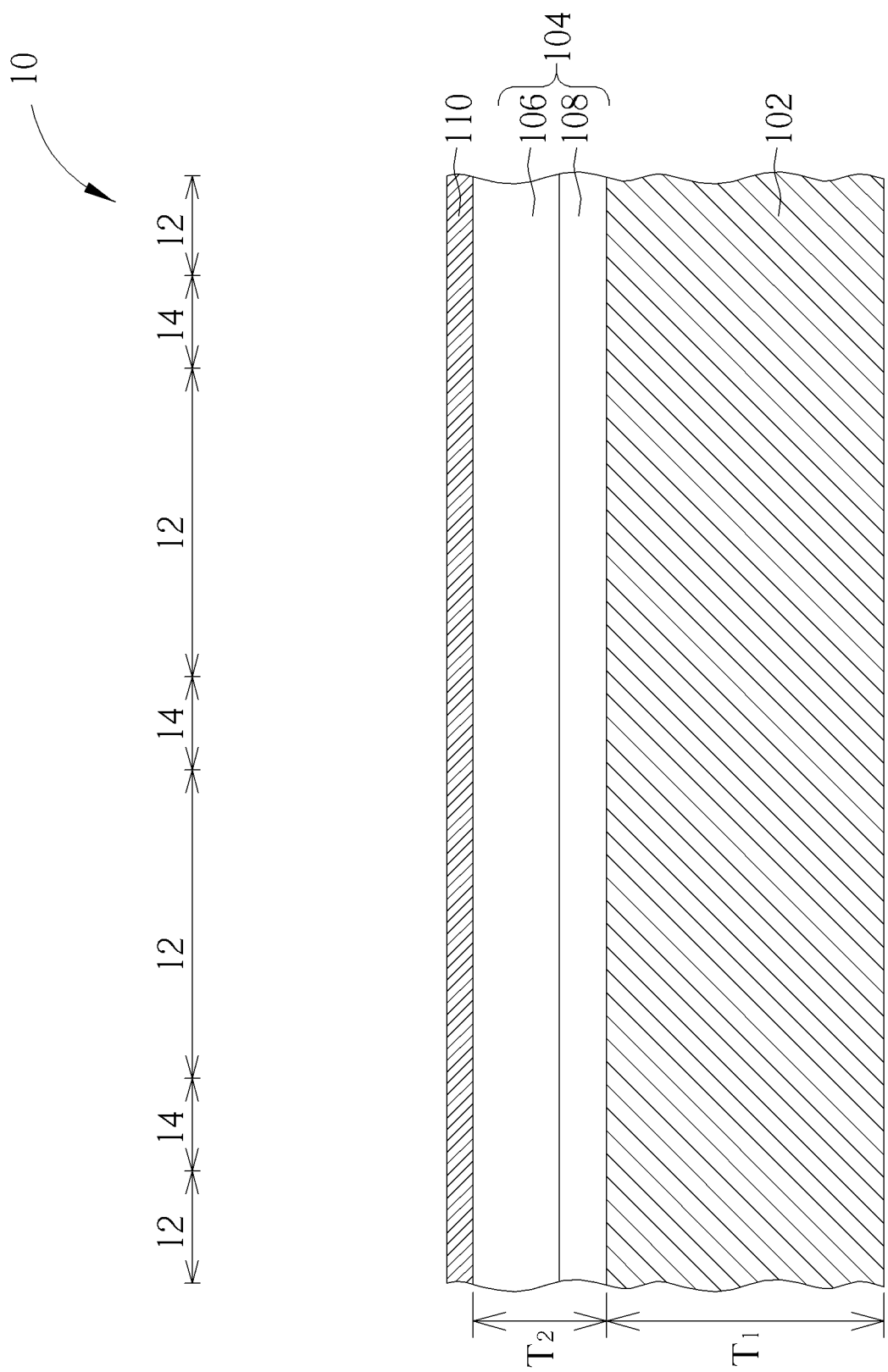
FIG. 2 is a schematic cross-sectional diagram of a wafer structure along a line A-A' of FIG. 1 according to one embodiment of the present disclosure.

FIG. 2 is a schematic cross-sectional diagram of a wafer structure taken along a line A-A' of FIG. 1 according to one embodiment of the present disclosure. Referring to FIG. 2, the wafer structure 10 includes a substrate 102, a stack of semiconductor layers 104, and a component layer 110. The substrate 102 may be a high mechanical strength substrate, such as silicon carbide (SiC), aluminum oxide ($Al_2O_3$), sapphire, aluminum nitride or other ceramic-based substrates, with a thickness $T_1$ of about 500 μm to about 900 μm (e.g., 500 μm, 600 μm, 700 μm, 800 μm, 900 μm, or any value therebetween). According to one embodiment of the present disclosure, a bonding layer (not shown) may be disposed on the surface of the substrate 102, so that the stack of the semiconductor layers 104 may be stacked on the ceramic substrate. The bonding layer may be materials containing silicon with a thickness of about 50 nm to about 500 nm. As disclosed herein, the term "high mechanical strength substrate" refers to any substrate with mechanical strength greater than that of a single crystal silicon substrate, and the compositions of the high mechanical strength substrate are not limited to the above compositions. According to one embodiment of the present disclosure, the mechanical strength of the high mechanical strength substrate is greater than about 340 MPa. According to some embodiments of the present disclosure, single-layered or multi-layered isolation layers and/or other suitable material layers, such as semiconductor layers, may be further provided and disposed between the substrate 102 and the stack of the semiconductor layers 104. The isolation layers may be composed of oxide, nitride, oxynitride, or other suitable isolation material. According to one embodiment of the present disclosure, single-layered or multi-layered isolation layers and/or other suitable material layers may wrap around the substrate 102.

The stack of the semiconductor layers 104 may continuously distribute on the substrate 102 so as to span at least two die regions and at least one scribe line region 14. The stack of the semiconductor layers 104 may have a thickness $T_2$ of about 1 μm to about 25 μm (e.g., 1 μm, 5 μm, 10 μm, 15 μm, 20 μm, 25 μm, or any value therebetween), and the stack of the semiconductor layers 104 may include a plurality of semiconductor sublayers, for example, a plurality of III-V semiconductor sublayers, and the composition of each III-V semiconductor sublayer includes GaN, InP, AlAs, GaAs, AlGaN, InAlGaN or InGaN, AlN, GaInP, AlGaAs, InAlAs, or InGaAs, but not limited thereto. According to one embodiment of the present disclosure, the stack of the semiconductor layers 104 may include a stress layer 106, such as a stress layer made of III-V semiconductors or other suitable semiconductors. In order to minimize the effect resulting from difference in coefficient of thermal expansion (CTE) and lattice constant of the stress layer 106 and the substrate 102, a buffer layer 108 (or a stress release layer) may be further disposed between the stress layer 106 and the substrate 102, so that the stack of the semiconductor layers 104 may include at least the buffer layer 108 and the stress layer 106 being disposed on the buffer layer 108. The buffer layer 108 may include a plurality of III-V semiconductor sublayers. According to some embodiments of the present disclosure, the compositions of the buffer layer 108 may be AlN, GaN, and aluminum gallium nitride ($Al_xGa_{1-x}N$, where 0<x<1), other suitable materials, or a combination thereof. The component layer 110 may be disposed on the stack of the semiconductor layers 104, and may include elements or layers, such as gate electrodes, source/drain electrodes, plugs, interconnects, dielectric layers, or passivation layers, and some of the elements or layers in the component layer 110 may extend into the stack of the semiconductor layers 104.

According to one embodiment of the present disclosure, in step 302 of the method 300, at least one high-temperature process and at least one cooling process are performed. The high-temperature process, for example, may be an epitaxial growth process with a temperature higher than 500° C., and the cooling process, for example, may be a process of placing the substrate in a room temperature environment after the epitaxial growth process is completed. According to one embodiment of the present disclosure, a process of fabricating the wafer structure 10 may include the steps as follows: providing the substrate 102; forming the stack of the semiconductor layers 104 on the substrate 102 under the condition that the processing temperature is greater than 500° C.; forming the component layer 110; and the substrate 102 is placed in an environment with a temperature of 25° C. to 30° C. after the stack of the semiconductor layers 104 is formed on the substrate 102. Since the above-mentioned processes include the high-temperature process and the cooling process, or even include repeating high-temperature processes and cooling processes, stress may be thus accumulated at the interface between the stack of the semiconductor layers 104 and the substrate 102.

Figure 3:
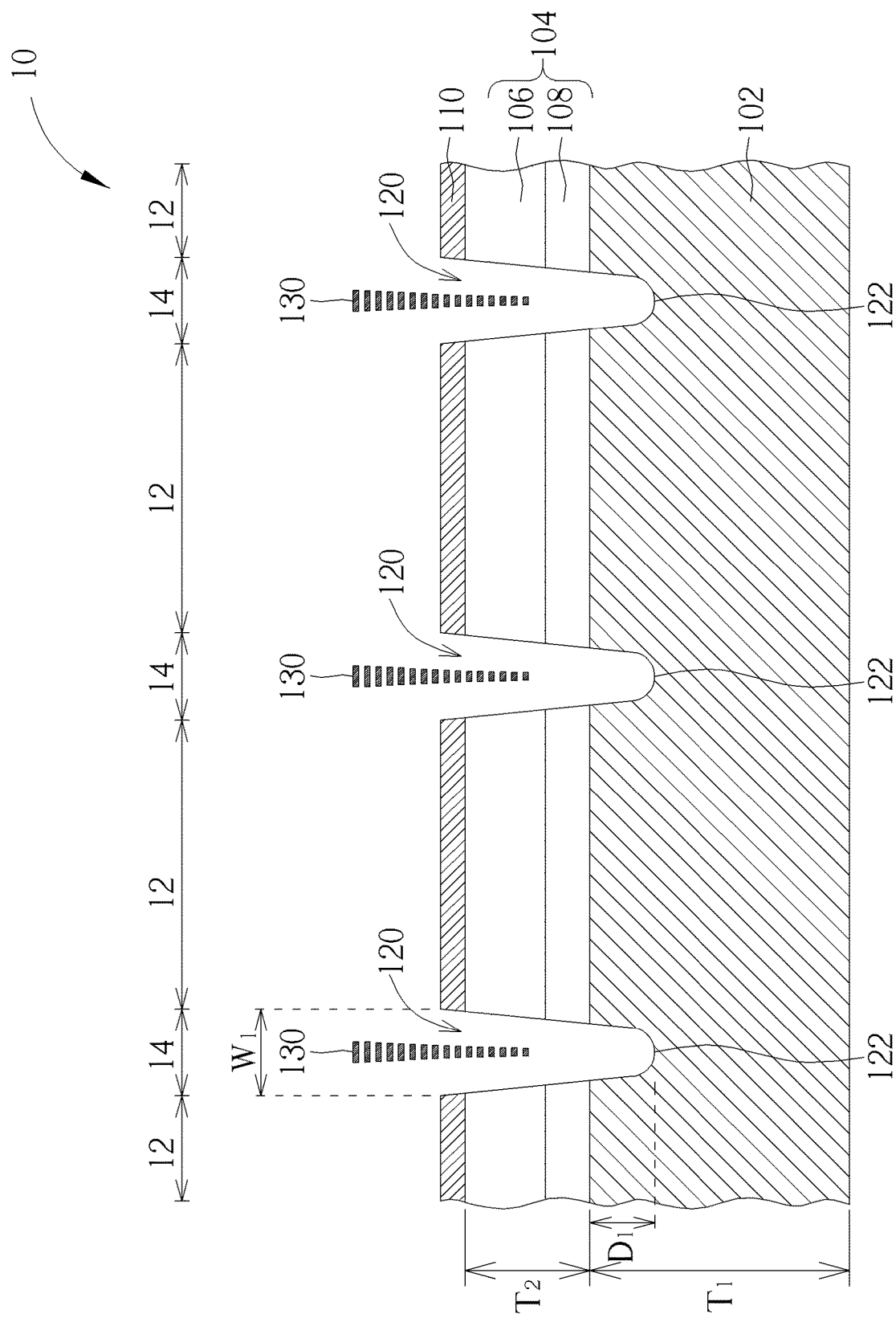
FIG. 3 is a schematic cross-sectional diagram of a wafer structure when grooves are formed in a wafer structure according to one embodiment of the present disclosure.

FIG. 3 is a schematic cross-sectional diagram of a wafer structure after the grooves are formed in the wafer structure according to one embodiment of the present disclosure. According to one embodiment of the present disclosure, in step 304, a laser grooving process may be performed on the scribe line regions 14 so that at least one layer (e.g., the component layer 110, the stack of the semiconductor layers 104, or the substrate 102) may be melted or vaporized by the laser beam 130. As a result, at least one groove 120 may be formed in the wafer structure 10, and the stack of the continuous semiconductor layers 104 may be interrupted. By interrupting the stack of the semiconductor layers 104, the stress accumulated in certain die regions 12 may not further propagates into adjacent die regions 12. Thus, the stress applied to the substrate 102 by the overall stack of the semiconductor layers 104 may be reduced. In addition, in order to further let the stress be uniformly distributed at the bottom surface 122 of the groove 120, or let stress being accumulated in one die region 12 less likely propagate into adjacent die regions 12, the grooves 120 may be further extended into the substrate 102, and the cross-sectional profile of each groove 120 may be a tapered profile with widths gradually reduced from top to bottom. For example, the opening of each groove 120 may have a width $W_1$ of about 20 μm to about 100 μm (e.g., 20 μm, 40 μm, 60 μm, 80 μm, 100 μm, or any value therebetween). Each groove 120 is in the substrate 102 with a depth $D_1$ of about 1 μm to about 50 μm (e.g., 1 μm, 5 μm, 10 μm, 20 μm, 30 μm, 40 μm, or 50 μm or any value therebetween), and the ratio of the depth $D_1$ of the groove 120 to the thickness $T_1$ of the substrate 102 is about 0.001 to about 0.06. It should be noted that the above laser grooving process is just an exemplary way to form the grooves 120, and other processes suitable for forming the grooves 120 may also be used as an alternate.

Figure 4:
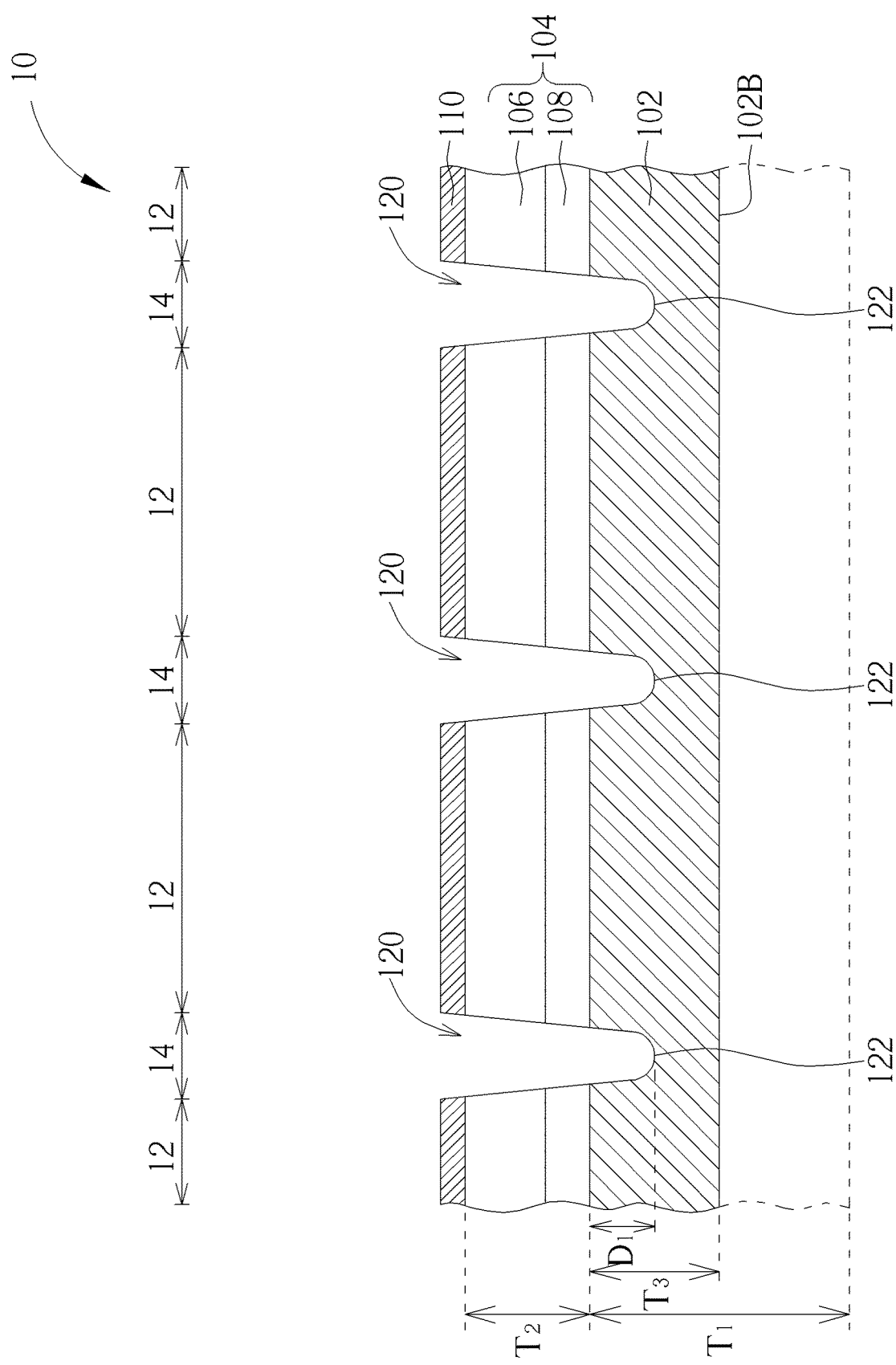
FIG. 4 is a schematic cross-sectional diagram of a thinned wafer structure according to one embodiment of the present disclosure.

FIG. 4 is a schematic cross-sectional diagram of a thinned wafer structure according to one embodiment of the present disclosure. In step 306, the substrate 102 may be further thinned after the groove 120 is formed. According to one embodiment of the present disclosure, a grinding process may be performed on the bottom surface 102B of the substrate 102 so that the thickness of the substrate 102 is reduced from the thickness T1 to the thickness T3 (the thickness T3 may be about 50 μm to about 250 μm, or any value therebetween). Since the grooves 120 are formed in the wafer structure 10 before the substrate 102 is thinned, the stress accumulated in one of the die regions 12 may not propagate into other adjacent die regions 12. In this way, even though the overall mechanical strength of the thinned substrate 102 is less than the overall mechanical strength of the original unthinned substrate 102, which may causes the substrate 102 to deform slightly, the stack of the semiconductor layers 104 in the die regions 12 may still not deform or peel off from the substrate 102 because the grooves may dissipate the stress effectively. According to one embodiment where the substrate 102 is wrapped around by single-layered or multi-layered isolation layers and/or other suitable material layers, during the process of grinding the bottom surface 102B of the substrate 102, the bottom surface 102B of the substrate 102 may be exposed from the single-layered or multi-layered isolation layers and/or other suitable material layers.

Figure 5:
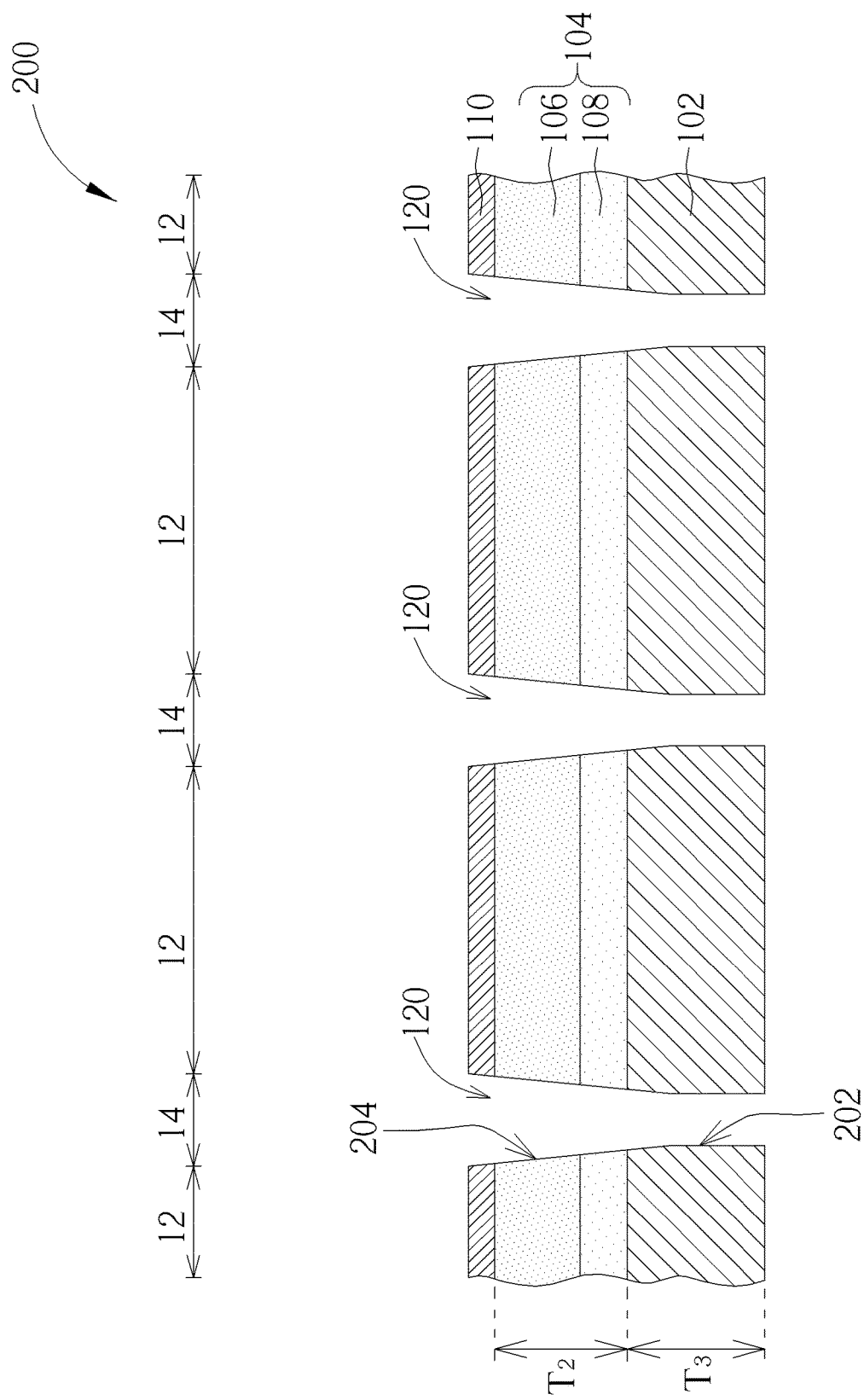
FIG. 5 is a schematic cross-sectional diagram of dice when the wafer structure is diced according to one embodiment of the present disclosure.

FIG. 5 is a schematic cross-sectional diagram of dice after the wafer structure is diced according to one embodiment of the present disclosure. In step 308, after the substrate is thinned, the substrates 102 in the adjacent die regions 12 may be separated from one another to form at least two die structured 200. According to one embodiment of the present disclosure, a cleaving process or a mechanical sawing process may be performed on the wafer structure, so that the substrate 102 under each groove 120 may be broken. During the process of forming the die structures 200, a lower sidewall 202 of the substrate 102 may have a first steepness, and a portion of the sidewall 204 of the stack of the semiconductor layers 104 (e.g., the sidewall of the stress layer 106) may have a second steepness, and the first steepness is greater than the second steepness.

According to the above embodiments, at least two die structures 200 may be fabricated by the method 300 including the steps of: laser grooving the wafer structure, thinning the substrate, separating the substrate, and so forth. However, the above embodiments are not intended to be limiting, and the present disclosure may include other embodiments which are disclosed in detail as follows. For the sake of brevity, only the differences among embodiments are disclosed in the following paragraphs.

Figure 10:
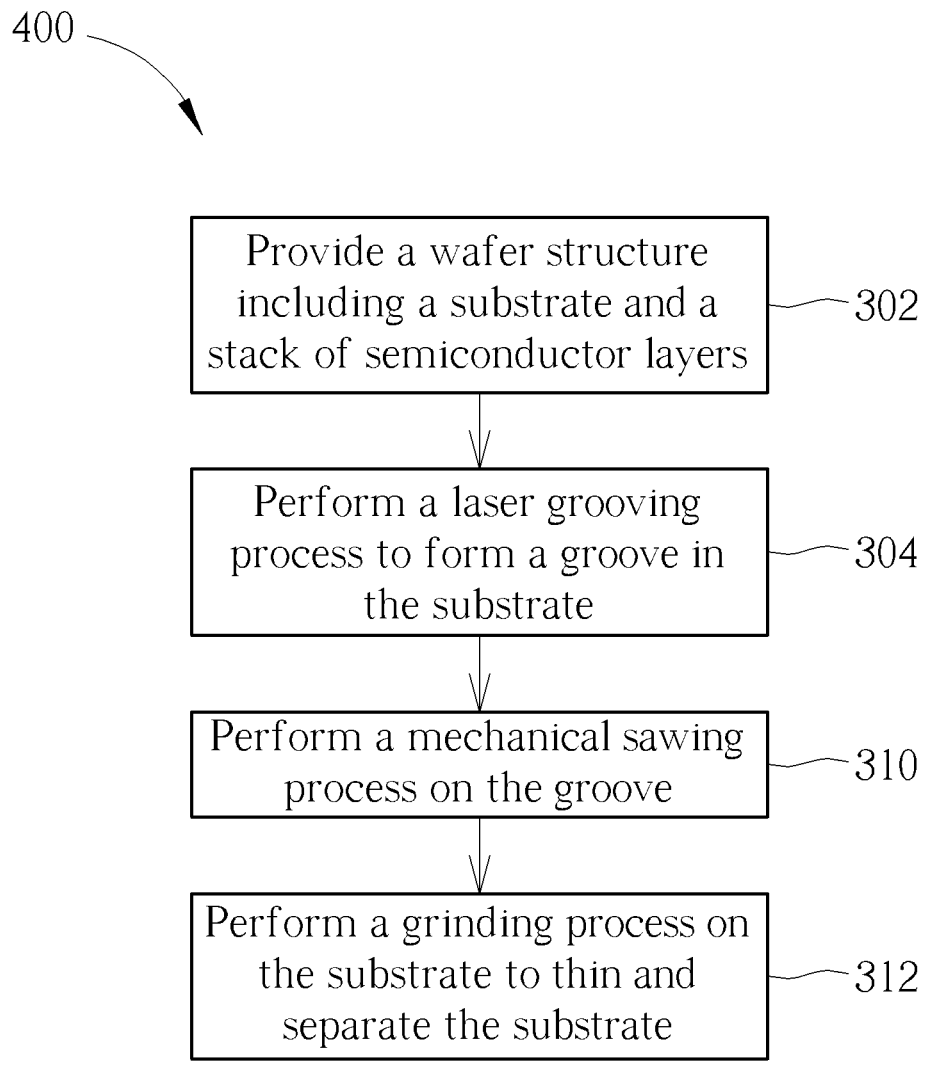
FIG. 10 is a flowchart illustrating a method of forming a plurality of dice according to another embodiment of the present disclosure.

FIG. 10 is a flowchart illustrating a method of forming a plurality of dice according to another embodiment of the present disclosure. According to one embodiment of the present disclosure, the method 400 of forming a plurality of dice may include the following steps. In step 302, a wafer structure is provided. Step 302 in accordance with the embodiment shown in FIG. 10 may be similar to step 302 in accordance with the embodiment shown in FIG. 9. By performing step 302, a structure similar to that shown in FIG. 2 may be obtained. Next, in step 304, a laser grooving process may be performed on the scribe line regions, so that the layers (e.g., component layer, the stack of the semiconductor layers, or substrates) in the scribe line regions may be melted or vaporized by the laser beam, thereby forming at least one groove in the wafer structure. Step 304 in accordance with the embodiment shown in FIG. 10 may be similar to step 304 in accordance with the embodiment shown in FIG. 9. By performing step 304, a structure similar to that shown in FIG. 3 may be obtained.

Figure 6:
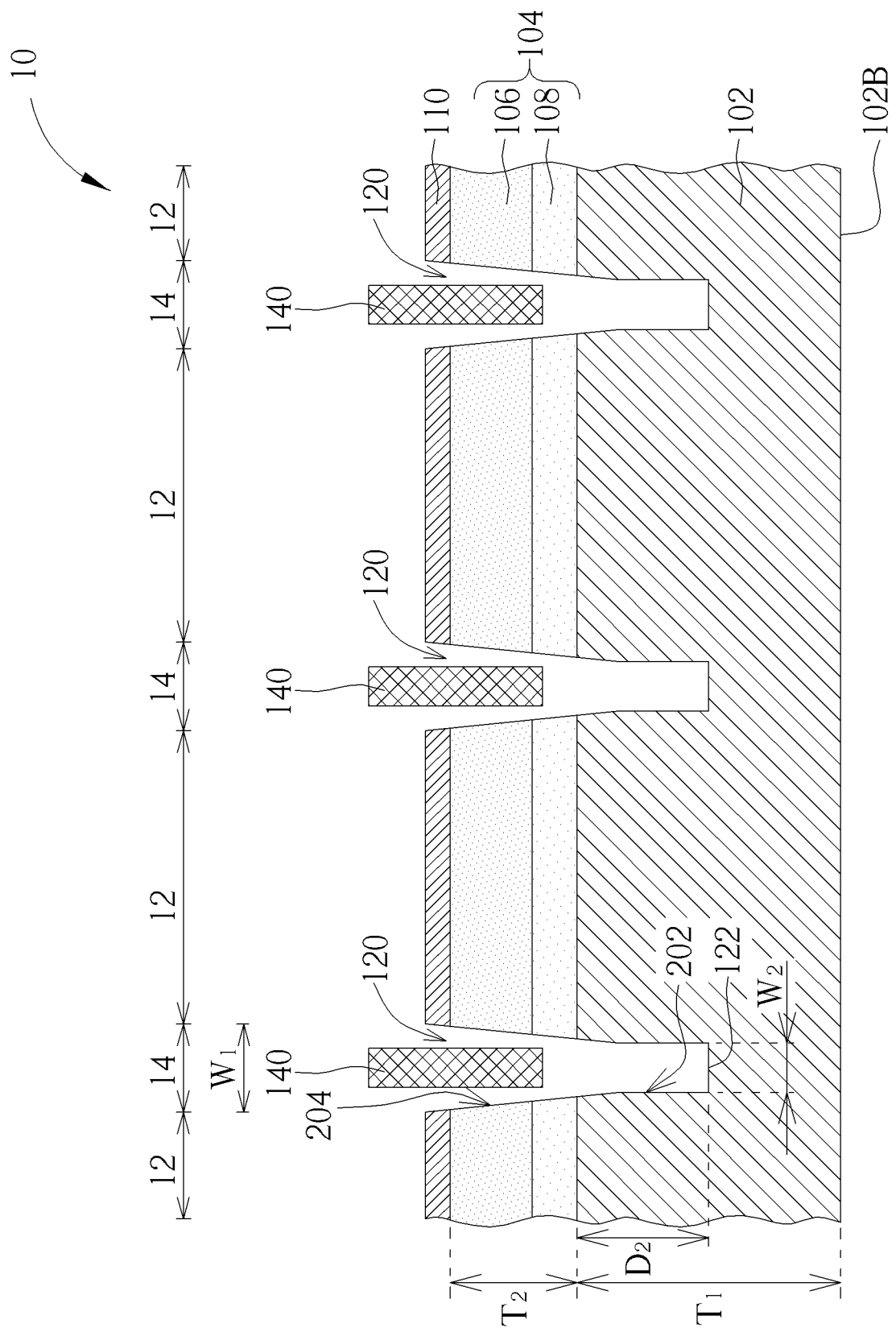
FIG. 6 is a schematic cross-sectional diagram of a wafer structure when grooves are deepened according to one embodiment of the present disclosure.

FIG. 6 is a schematic cross-sectional diagram of a wafer structure after the groove is deepened according to one embodiment of the present disclosure. In step 310, after the grooves 120 are formed by performing the processes above, the grooves 120 may be further deepened. For example, a mechanical sawing process may be used to deepen the grooves 120 from a original depth $D_1$ to a depth $D_2$. The thickness of the saw blade 140 used in the mechanical sawing process may determine the width $W_2$ of the bottom surface 122 of each groove 120 during the deepening process. According to one embodiment of the present disclosure, the width $W_2$ of the bottom surface 122 of the groove 120 is smaller than the width $W_1$ of the opening of the groove 120. In addition, after the grooves 120 are deepened, the steepness of the lower sidewall 202 of each groove 120 may be greater than the steepness of the upper sidewall 204 (e.g., the sidewall of the stress layer 106) of each groove 120. Since the bottom surfaces 122 of the grooves 120 are already located in the substrate 102 before the mechanical sawing process is performed, the stress incurring by the saw blade 140 may not extend laterally from the bottom surfaces 122 of the grooves 120 to the stack of the semiconductor layers 104 during the mechanical sawing process. As a result, a complete stack of the semiconductor layers 104 without any structural damages (e.g. cracks) may be obtained.

Figure 7:
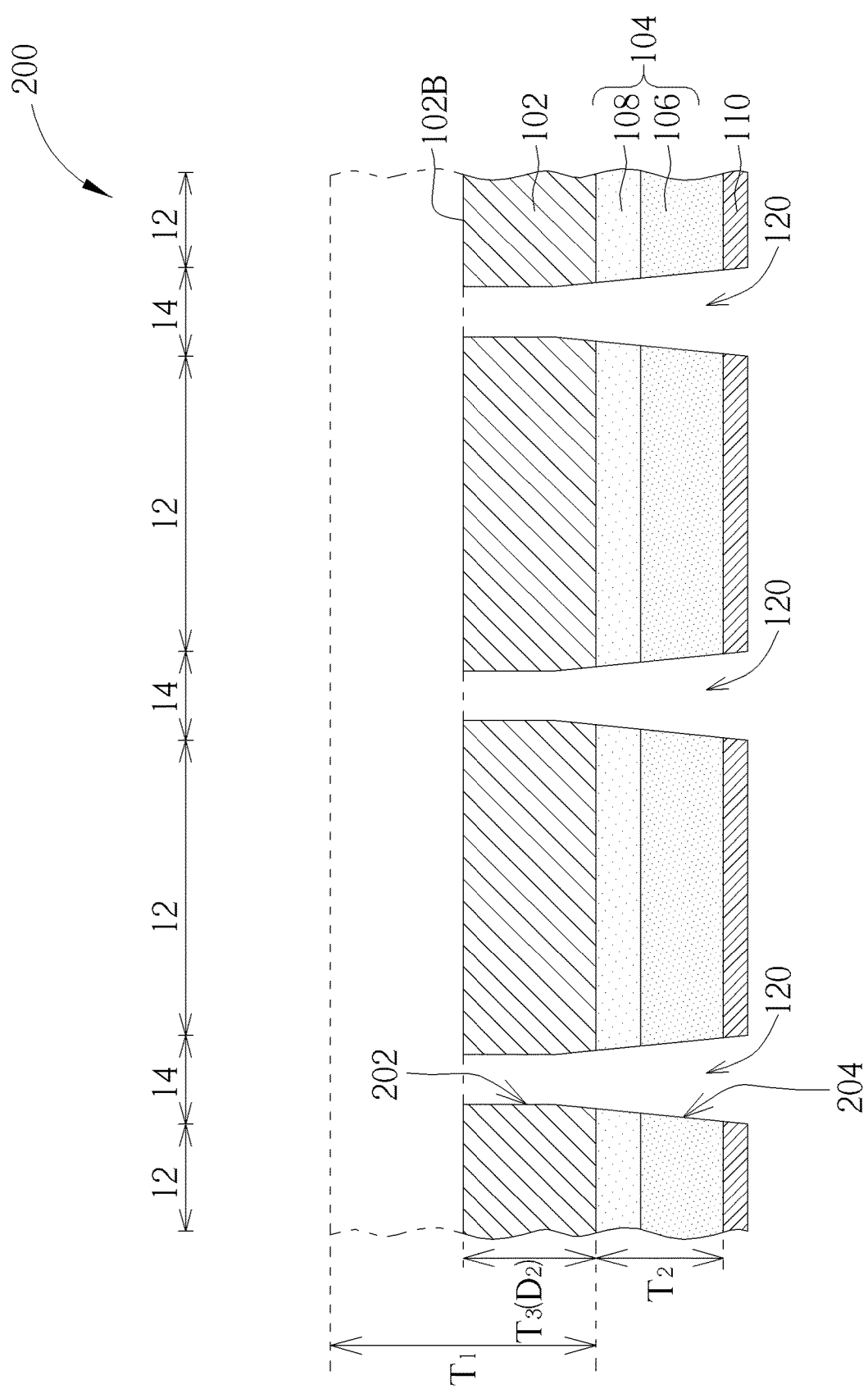
FIG. 7 is a schematic cross-sectional diagram of a thinned wafer structure according to one embodiment of the present disclosure.

FIG. 7 is a schematic cross-sectional diagram of a thinned wafer structure according to one embodiment of the present disclosure. In step 312, one side of the wafer structure (e.g., the component layer side) may be attached to a stage, and the bottom surface 102B of the substrate 102 may be subjected to a grinding process to reduce the thickness of the substrate 102 from the thickness $T_1$ to the thickness $T_3$ (the thickness $T_3$ may be about 50 µm to about 250 µm, or any value therebetween). When the grinding process is completed, the substrate 102 in the adjacent die regions 12 may be separated from each other to thereby form at least two die structures 200. The thickness $T_3$ of the substrate 102 in each die structure 200 may be smaller than the depth $D_2$ of each original groove 120 in the substrate 102 before the grinding process is performed. Therefore, by performing the grinding process, the purpose of thinning the substrate 102 and separating the die regions 12 of the substrate 102 may be achieved at the same time.

Figure 8:
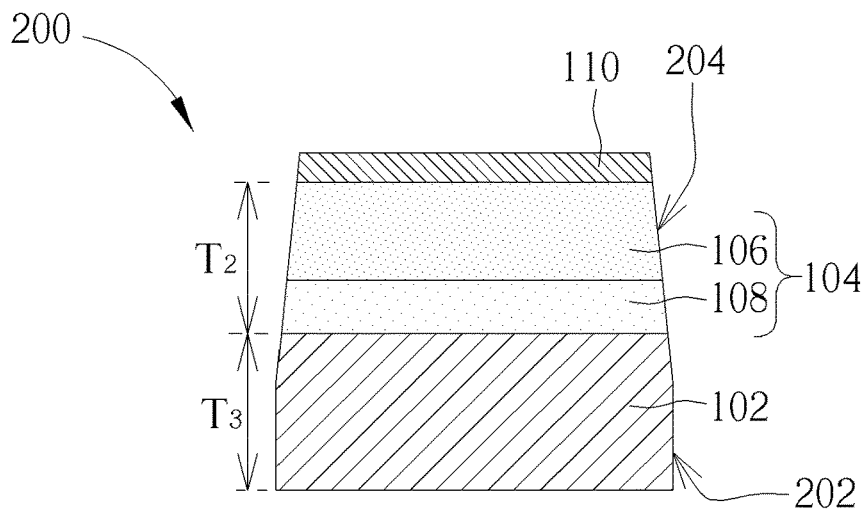
FIG. 8 is a schematic cross-sectional diagram of a die structure according to one embodiment of the present disclosure.

FIG. 8 is a schematic cross-sectional diagram of a die structure according to one embodiment of the present disclosure. By performing the methods 300 or 400 of forming a plurality of dice, at least one die structure 200 may be obtained. Referring to FIG. 8, according to one embodiment of the present disclosure, the die structure 200 may include a substrate 102 and a stack of the semiconductor layers 104 disposed on the substrate 102. The substrate 102 may be, for example, a ceramic substrate, and the stack of the semiconductor layers 104 may be, for example, a stack of III-V semiconductor layers. The substrate 102 has a first thickness less than 250 µm, and the stack of the semiconductor layers 104 has a second thickness. The ratio of the second thickness to the first thickness is about 0.004 to about 0.5. When the stack of the semiconductor layers 104 is a stack of III-V semiconductor layers, it may include a plurality of III-V semiconductor sublayers, and the composition of each III-V semiconductor sublayer may include GaN, InP, AlAs, GaAs, AlGaN, InAlGaN, or InGaN. In addition, the stack of the III-V semiconductor layers may further include a buffer layer 108 and a stress layer 106 disposed on the buffer layer 108. Furthermore, a portion of the sidewall 202 of the substrate 102 has a first steepness, and a portion of the sidewall 204 of the stack of the semiconductor layers has a second steepness. The first steepness is greater than the second steepness. According to the above embodiments, before the substrate is thinned, grooves interrupting the stack of the semiconductor layers are formed in the wafer structure to release the stress being accumulated in the stack of the semiconductor layers or at the interface between the stack of the semiconductor layers and the wafer substrate. Therefore, the wafer structure is less prone to deformation such as bow or warp, and the stack of semiconductor layers is less likely to peel off from the wafer substrate. As a result, the yield of the entire process may be increased effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A die structure having a high-electron mobility transistor device, comprising:
   a substrate having a first thickness, wherein the substrate is a ceramic substrate comprising aluminum nitride, silicon carbide, aluminum oxide, or a combination thereof;
   a stack of semiconductor layers disposed on the substrate, the stack of the semiconductor layers having a second thickness, wherein a ratio of the second thickness to the first thickness is from 0.004 to 0.5;
   at least one isolation layer disposed between the substrate and the stack of semiconductor layers;
   a silicon-containing bonding layer disposed between the substrate and the stack of semiconductor layers; and
   a component layer disposed on the stack of semiconductor layers, wherein the component layer comprises at least a gate electrode, a source electrode and a drain electrode,
   wherein a portion of the sidewall of the substrate comprises a first steepness, and a portion of the sidewall of the stack of the semiconductor layers comprises a second steepness, wherein the first steepness is greater than the second steepness.

2. The die structure according to claim 1, wherein the first thickness is less than 250 µm, and the second thickness is from 1 µm to 25 µm.

3. The die structure according to claim 1, wherein the mechanical strength of the substrate is greater than 340 MPa.

4. The die structure according to claim 1, wherein the stack of the semiconductor layers comprises a plurality of III-V semiconductor sublayers.

5. The die structure according to claim 4, wherein the composition of each of the III-V semiconductor sublayers comprises gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), aluminum gallium arsenide (AlGaAs), indium aluminum arsenide (InAlAs), indium gallium arsenide (InGaAs), or a combination thereof.

6. The die structure according to claim 1, wherein the stack of the semiconductor layers comprises a buffer layer and a stress layer disposed on the buffer layer.

* * * * *